(12) United States Patent
Yamamoto et al.

(10) Patent No.: US 6,388,599 B2
(45) Date of Patent: May 14, 2002

(54) REFERENCE VOLTAGE GENERATOR CIRCUIT USING PAIRS OF FINE AND ROUGH RESISTOR BANKS

(75) Inventors: Katsuyoshi Yamamoto; Toshitaka Mizuguchi, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/768,175

(22) Filed: Jan. 24, 2001

Related U.S. Application Data

(62) Division of application No. 09/211,036, filed on Dec. 15, 1998, now Pat. No. 6,204,791.

(30) Foreign Application Priority Data

Jun. 16, 1998 (JP) ............................................. 10-168832

(51) Int. Cl.<sup>7</sup> ............................. H03M 1/66; H03M 1/78
(52) U.S. Cl. ........................................ 341/154; 341/145
(58) Field of Search ................................. 341/154, 122, 341/144, 145, 155, 156

(56) References Cited

U.S. PATENT DOCUMENTS

| | | | | |
|---|---|---|---|---|
| 5,014,054 A | * | 5/1991 | Oshita et al. | 341/145 |
| 5,059,978 A | * | 10/1991 | Valdenaire | 341/145 |
| 5,138,319 A | * | 8/1992 | Tesch | 341/156 |
| 5,781,141 A | | 7/1995 | Ikuta et al. | |
| 5,455,582 A | | 10/1995 | Valdenaire | |
| 5,627,537 A | * | 5/1997 | Quinlan et al. | 341/144 |
| 5,673,045 A | | 9/1997 | Sato et al. | |

FOREIGN PATENT DOCUMENTS

| | | |
|---|---|---|
| JP | 3-165628 | 7/1991 |
| JP | 7-297724 | 11/1995 |

OTHER PUBLICATIONS

Office Action (with English translation) in Korean patent application No. 9–5–2001–007085557 dated May 27, 2001 citing the above references.

* cited by examiner

*Primary Examiner*—Patrick Wamsley
(74) *Attorney, Agent, or Firm*—Armstrong, Westerman, Hattori, McLeland & Naughton, LLP

(57) ABSTRACT

A reference voltage generator circuit generates a stable reference voltage that may be used by other circuits, such as an A/D converter and a D/A converter. The reference voltage generator circuit includes a rough resistor bank having a pair of first resistors connected in series between a low potential reference voltage and a high potential reference voltage. A first fine resistor bank is connected in shunt with one of the resistors in the rough resistor bank and a second fine resistor bank is also connected in shunt with the same resistor in the rough resistor bank. Switches are connected between nodes between the resistors in the fine resistor banks and another circuit or system, such as an A/D converter.

4 Claims, 7 Drawing Sheets

REFERENCE VOLTAGE GENERATOR CIRCUIT USING PAIRS OF FINE AND ROUGH RESISTOR BANKS

This application is a division of prior application Ser. No. 09/211,036 filed Dec. 15, 1998 now U.S. Pat. No. 6,204,791.

BACKGROUND OF THE INVENTION

1. Field of the Invention

The invention relates to a reference voltage generator circuit for generating a reference voltage or voltages to be used in a converter, such as an A/D or a D/A converter, and more particularly, to a generator circuit for providing reference voltages to a plurality of systems.

2. Description of the Related Art

As shown in FIG. 1, a conventional reference voltage generator circuit 10 comprises a rough resistor bank 11 including a pair of resistors RI of an equal resistance, and a first and second fine resistor bank 12, 13 each including four resistors R2 of an equal resistance.

The resistors R1 are connected in series between a high potential side reference voltage $V_{ref1}$, and a low potential side reference voltage $V_{ref2}$. The first resistor bank 12 is connected in shunt with the resistor R1 located toward the reference voltage $V_{ref1}$, and the second resistor bank 13 is connected in shunt with the resistor R1 located toward the reference voltage $V_{ref2}$. Each of the resistor banks 12, 13 includes four resistors R2 connected in series.

A potential difference between the reference voltages $V_{ref1}$, $V_{ref2}$ is equally divided across each resistor R1, and the voltage across each resistor R1 is divided into four equal fractions across each resistor R2. Nodes N1 to N9 are defined at junctions between each resistor R1 and its adjacent resistor R2 as well as at junctions between respective adjacent resistors R2 in the order of descending potential, as shown.

Each of the nodes N1 to N3 is connected to a circuit A1 in a subsequent stage via respective switches SA1, and is also connected to a circuit B1 in a subsequent stage via respective switches SB1. Each of the nodes N3 to N5 is connected to a circuit A2 in a subsequent stage via respective switches SA2, and is also connected to a circuit B2 in a subsequent stage via respective switches SB2. Each of the nodes N5 to N7 is connected to a circuit A3 in a subsequent stage via respective switches SA3, and is also connected to a circuit B3 in a subsequent stage via respective switches SB3. Each of the nodes N7 to N9 is connected to a circuit A4 in a subsequent stage via respective switches SA4, and is also connected to a circuit B4 in a subsequent stage via respective switches SB4. The circuits A1 to A4 and the circuits B1 to B4 (not shown) are comparators associated with independent A/D converters.

A select signal generator circuit 14 generates select signals φA1 to φA4 and φB1 to φB4 which actuate corresponding switches SA1 to SA4 and SB1 to SB4. Thus, each of the switches SA1 to SA4 and SB1 to SB4 is turned on or off in response to a corresponding one of the select signals (φA1 to φA4 and φB1 to φB4. In this manner, potentials at the respective nodes N1 to N9 are provided as reference voltages to the circuits A1 to A4 and B1 to B4.

It is to be noted that as the selected switches SA1 to SA4 and SB1 to SB4 are turned on or off, switching noise occurs. For example, assuming that the switches SA1 are turned on in response to the select signal φA1, if the switches SB1 are then turned on in response to the select signal φB1, the operation of the switches SB1 produces switching noises at the nodes N1 to N3. In this instance, the node N3 exhibits a higher impedance with respect to the reference voltages $V_{ref1}$, $V_{ref2}$ than the nodes N1, N2, and consequently a noise level at the node N3 is higher than at the nodes N1, N2. This causes an unstable reference voltage of a reduced accuracy to be provided to the circuit A1 connected to the node N3, such that the circuit A1 may malfunction.

To overcome such a problem, a separate reference voltage generator circuit 10 may be provided for each group of circuits A1 to A4 and B1 to B4. when so arranged, there is only one switch associated with each node, thus avoiding adverse influences of one of the switches upon another of the switches.

However, such an arrangement has greatly increased circuit area. In addition, the high potential side and the low potential side reference voltages must be provided to individual reference voltage generator circuits, and accordingly, the reference voltages may vary from reference voltage generator circuit to reference voltage generator circuit due to wiring resistances, resulting in a variation in the magnitude of reference voltages provided to the individual reference voltage generator circuits. In order to reduce such a variation in the reference voltages, it is preferred that common reference voltages be delivered in parallel from a single reference voltage generator circuit.

It is an object of the present invention to provide a reference voltage generator circuit capable of providing a stable reference voltage.

SUMMARY OF THE INVENTION

To achieve the above objective, the present invention provide a reference voltage generator circuit for delivering a reference voltage to a plurality of systems including a first system and a second system, comprising: a rough resistor bank including at least one resistor connected in series between a high potential side reference voltage and a low potential side reference voltage; a first fine resistor bank including a plurality of resistors connected in shunt with at least on resistor of the rough resistor bank; a second fine resistor bank including a plurality of resistors connected in shunt with the at least one resistor in the rough resistor bank; a first group of switches connected between nodes between respective resistors in the first fine resistor bank and the first system; and a second group of switches connected between nodes between respective resistors in the second fine resistor bank and the second system.

The present invention further provides a reference voltage generator circuit for delivering reference voltages to a plurality of systems including a first system and a second system, comprising: a first rough resistor bank including at least one resistor and a second rough resistor bank including at least two resistors, the first and second rough resistor bank connected in parallel with each other between a high potential side and a low potential side reference voltage; a first fine resistor bank connected between the first and second rough resistor banks and connected in shunt with the at least one resistor bank in the first rough resistor and extending between the at least one resistor and a junction between at least two resistors in the second rough resistor bank; a second fine resistor bank connected in parallel with the first fine resistor bank; a first group of switches connected between nodes between adjacent resistors in the first fine resistor bank and the first system; and a second group of switches connected between nodes between adjacent resistors in the second fine resistor bank and the second system.

The present invention provides a reference voltage generator circuit for delivering reference voltages to a plurality of systems including a first system and a second system, comprising: a rough resistor bank including at least two resistors connected in series between a high potential side reference voltage and a low potential side reference voltage; a first fine resistor bank including a plurality of series connected resistors connected in shunt with one of the resistors in the rough resistor bank; a second fine resistor bank including a plurality of series connected resistors connected in shunt with one of the resistors in the rough resistor bank; a first group of switches connected between nodes between adjacent resistors in the first fine resistor bank and the first system; a second group of switches connected between nodes between adjacent resistors in the second fine resistor bank and the second system; and a selection circuit for selectively connecting each of the first and second fine resistor banks to one of the resistors in the rough resistor bank.

The present invention further provides a reference voltage generator circuit for delivering reference voltages to a plurality of systems including a first system and a second system, comprising: a rough resistor bank connected in series between a high potential side and a low potential side different voltage; a first fine resistor bank connected in shunt across a plurality of resistors in the rough resistor bank; a second fine resistor bank connected in shunt with the plurality of resistors in the rough resistor bank; a third fine resistor bank connected in shunt with one of the resistors in the rough resistor bank; a fourth fine resistor bank connected in shunt with one of the resistors in the rough resistor bank; a first group of switches connected between nodes between adjacent resistors in the first fine resistor bank and the first system; a second group of switches connected between nodes between adjacent resistors in the second fine resistor bank and the second system; a third group of switches connected between nodes between adjacent resistors in the third fine resistor bank and the first system; and a fourth group of switches connected between nodes between adjacent resistors in the fourth fine resistor bank and the second system.

Other aspects and advantages of the invention will become apparent from the following description, taken in conjunction with the accompanying drawings, illustrating by way of example the principles of the invention.

BRIEF DESCRIPTION OF THE DRAWING

The invention, together with the objects and advantages thereof, may best be understood by reference to the following description of the presently preferred embodiments with reference to the accompanying drawings in which.

DETAILED DESCRIPTION OF THE PREFERRED EMBODIMENTS

Figure 1:
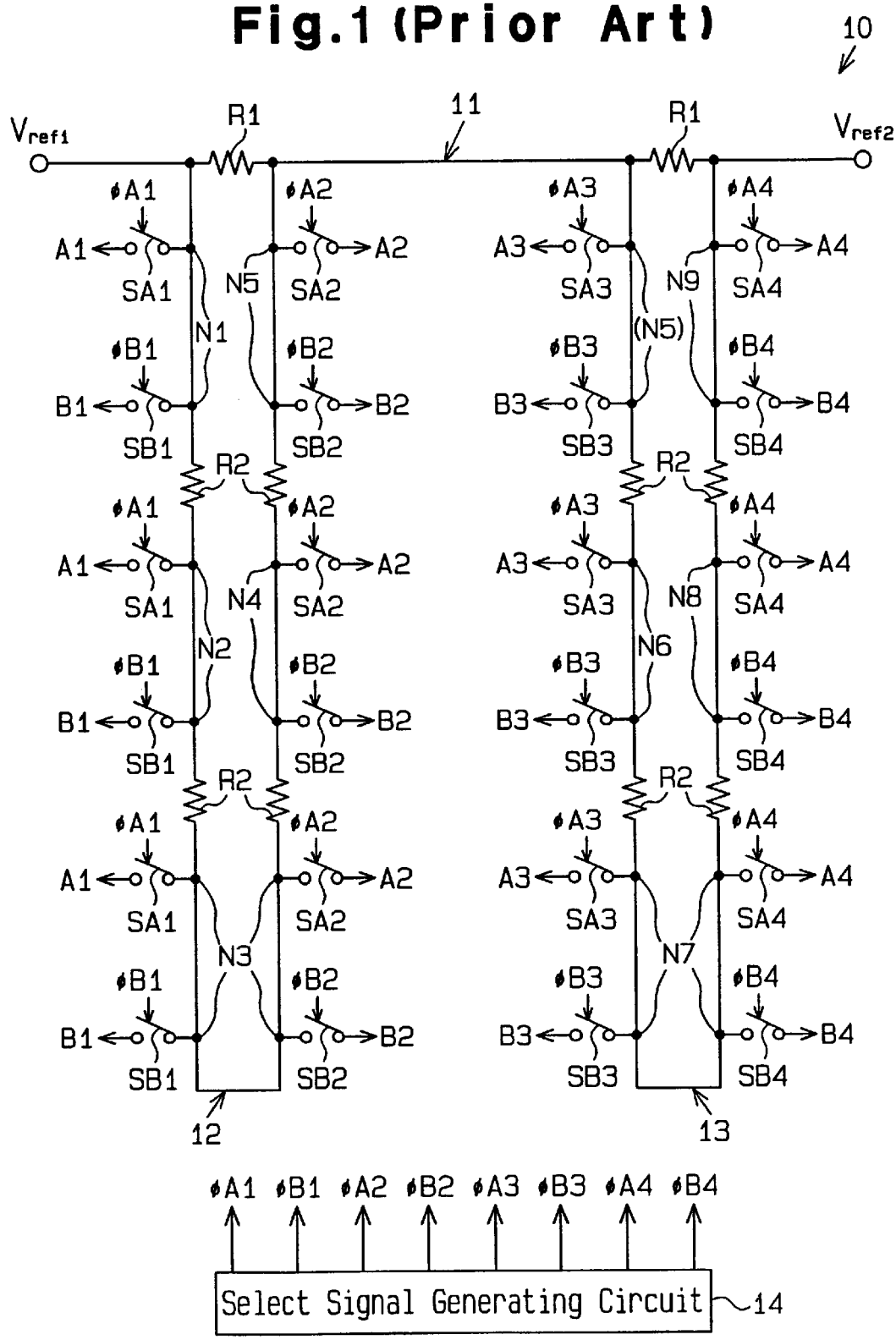
FIG. 1 is a circuit diagram of a conventional reference voltage generator circuit.

In the drawings, like numerals are used for like elements throughout.

FIRST EMBODIMENT

Figure 2:
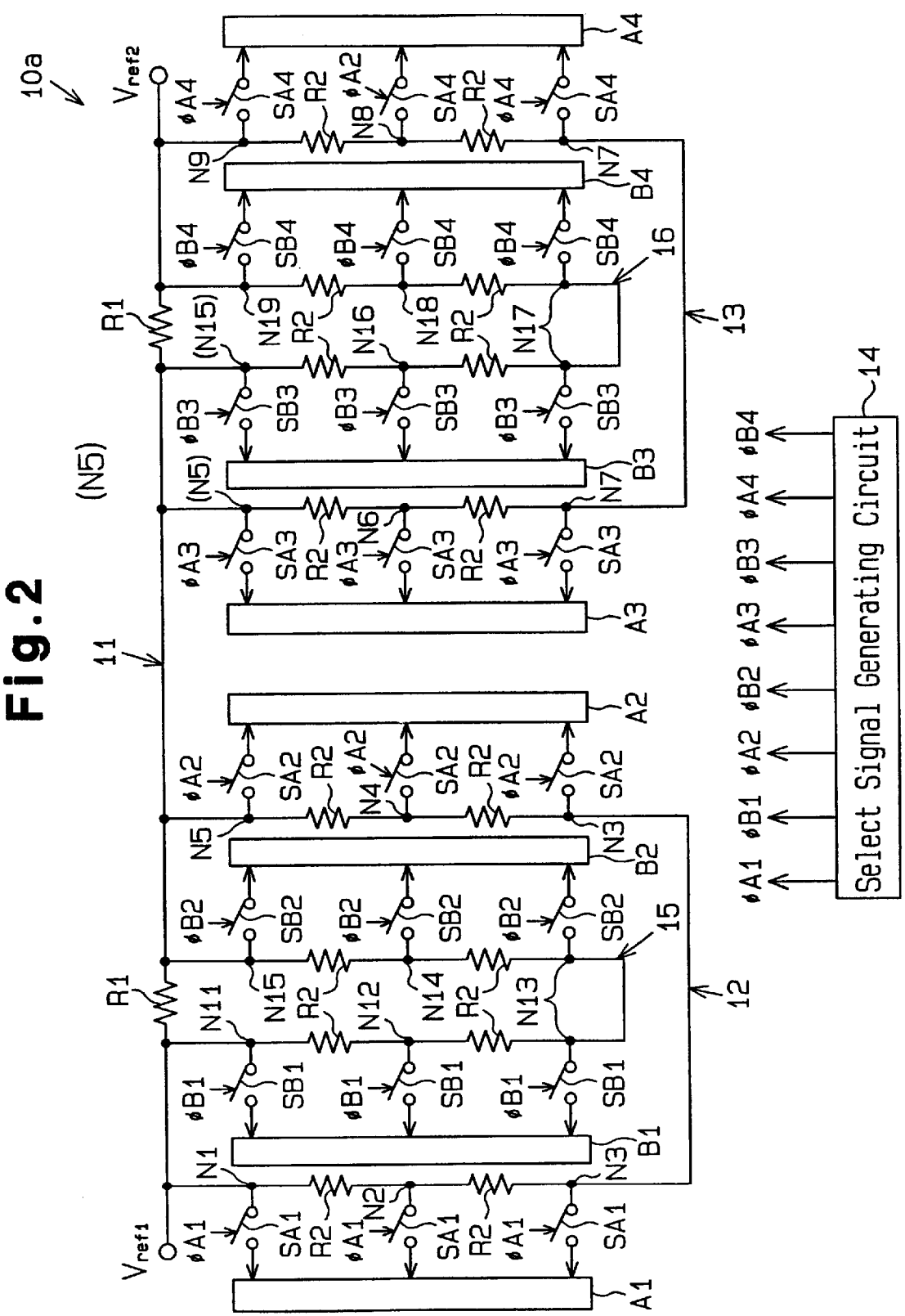
FIG. 2 is a circuit diagram of a reference voltage generator circuit according to a first embodiment of the present invention.

Referring to FIG. 2, a reference voltage generator circuit 10a according to a first embodiment of the present invention will now be described. The reference voltage generator circuit 10a comprises a first and a third resistor bank 12, 15 which are connected in shunt with the resistor R1 located toward the reference voltage $V_{ref1}$, and a second and a fourth resistor bank 13, 16 connected in shunt with the resistor R1 located toward the reference voltage $V_{ref2}$.

Further, the first and third resistor banks 12, 15 are connected in shunt with each other, as are the second and fourth resistor banks 13, 16. Each of the resistor banks 12, 13, 15, 16 includes four resistors R2 of substantially equal resistance which are connected in series. For the third and fourth resistor banks 15, 16, nodes N11 to N19 are respectively defined at junctions between the resistor R1 and the adjacent resistor R2 and at junctions between adjacent resistors R2 in the order of descending potential.

Switches SA1 are connected to each of the nodes N1 to N3, switches SA2 are connected to each of the nodes N3 to N5, switches SA3 are connected to each of the nodes N5 to N7, and switches SA4 are connected to each of the nodes N7 to N9. On the other hand, switches SB1 are connected to each of the nodes N11 to N13, switches SB2 are connected to each of the nodes N13 to N15, switches SB3 are connected to each of the nodes N15 to N17, and switches SB4 are connected to each of the nodes N17 to N19.

Circuits A1 to A4 and B1 to B4 are connected to the corresponding switches SA1 to SA4 and SB1 to SB4, respectively. The resistor bank 11 is common to both circuits A1 to A4 and B1 to B4. The first and the second resistor banks 12, 13 are provided for a first system including the circuits A1 to A4, and the third and fourth resistor banks 15, 16 are provided for a second system including the circuits B1 to B4. The first and second resistor banks 12, 13 provide the potentials at the nodes N1 to N9 to the first system while the second and fourth resistor banks 15, 16 provide the potentials at the nodes N11 to N19 to the second system. It is to be noted that the potentials at the nodes N1 to N9 are substantially equal to the potentials at corresponding nodes N11 to N19.

The switches SA1 to SA4 are selected or turned on in response to corresponding select signals φA1 to φA4. The potentials at the respective nodes N1 to N9 are delivered as reference voltages to the circuits A1 to A4 via the selected switches SA1 to SA4. Similarly, the switches SB1 to SB4 are selected or turned on in response to corresponding select signals φB1 to φB4. The potentials at the nodes N11 to N19 are delivered as reference voltages to the circuits B1 to B4 via the selected switches SB1 to SB4.

The operation of the first and third resistor banks 12, 15 which are located toward the reference voltage $V_{ref1}$ will now be described. The operation of the second and fourth resistor banks 13, 16 which are located toward the reference voltage $V_{ref2}$ is similar to the operation of the first and third resistor banks 12, 15.

If the switches SA1 are selected by the select signals φA1, and substantially simultaneously the switches SB1 are selected in response to the select signals φB1 the occurrence of noise at the nodes N1 to N3 caused by the switches SB1 is suppressed since the first and third resistor banks 12, 15 are separate. In this instance, the node N13 exhibits an impedance with respect to the reference voltage $V_{ref1}$ which is higher than the impedance the nodes N11 and N12 exhibit, and accordingly, a noise level at the node N13 is higher than at the nodes N11, N12. However, two of the resistors R2 are interposed between the first resistor bank 12 and the node N13, to which the reference voltage $V_{ref1}$ is provided, and accordingly, the noise at the node N13 is not propagated to the first resistor bank 12. Because the switches SA1 and SB1 are connected in parallel with each other, an adverse influence of the switching noise from the switches SB1 upon the switches SA1 is expected at the node N1 (or node N11). However, the node N1 (or node N11) exhibits a low impedance with respect to the reference voltage $V_{ref1}$, and hence the switching noise caused by the switches SB1 is low. In this manner, the switching noise from the switches SB1 does not have a significant influence on the reference voltage generated by the reference voltage generator circuit 10a.

As described above, as a result of the parallel connection of the first and third resistor banks 12, 15 and the parallel connection of the second and fourth resistor banks 13, 16, an adverse influence of switching noise on the potentials at the nodes N11 to N19 is suppressed. Consequently, the reference voltage generator circuit 10a provides a stable reference voltage to the circuits A1 to A4 and B1 to B4.

SECOND EMBODIMENT

Figure 3:
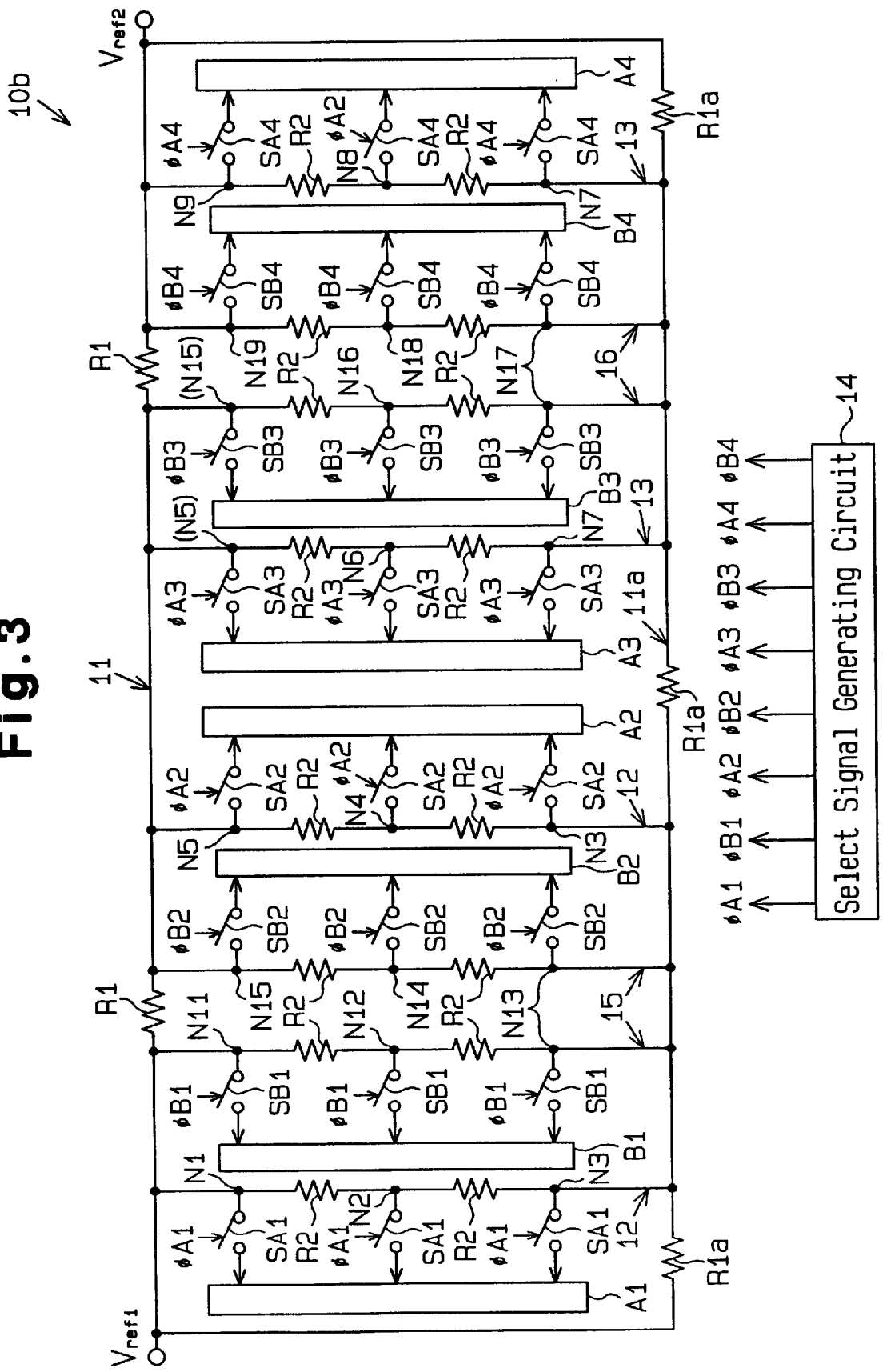
FIG. 3 is a circuit diagram of a reference voltage generator circuit according to a second embodiment of the present invention.

Referring to FIG. 3, a reference voltage generator circuit 10b according to a second embodiment of the present invention will now be described, principally dealing with its distinction over the reference voltage generator circuit 10a of the first embodiment.

The reference voltage generator circuit 10b comprises a first rough resistor bank 11, and a second rough resistor bank 11a connected in shunt with the first rough resistor bank 11. The second rough resistor bank 11a includes three resistors R1a of substantially equal resistance which are connected in series with each other between the high potential side reference voltage $V_{ref1}$ and the low potential side reference voltage $V_{ref2}$. The first resistor bank 12 is connected in parallel with the third resistor bank 15 and the second resistor bank 13 is connected in parallel with the fourth resistor bank 16.

It is to be noted with respect to the second rough resistor bank 11a that nodes N3 and N13 are connected between two adjacent resistors R1a located toward the reference voltage $V_{ref1}$, and nodes N7 and N17 are connected between two adjacent resistors R1a located toward the reference voltage $V_{ref2}$.

The operation of the reference voltage generator circuit 10b will now be described. While the operation of the first and third resistor banks 12, 15 which are located toward the reference voltage $V_{ref1}$ is described, it is to be understood that the second and fourth resistor banks 13, 16 which are located toward the reference voltage $V_{ref2}$ operate similarly.

Aligned switches SA1 to SA4 and SB1 to SB4 are selected or turned on in response to corresponding select signals φA1 to φA4 and (φB1 to φB4. A potential at each of the nodes N1 to N9 and N11 to N19 is delivered as a reference voltage to one of the circuits A1 to A4 and B1 to B4 via the selected one of the switches SA1 to SA4 and SB1 to SB4.

If the switches SB1 are selected in response to the select signal φB1 at substantially the same time that the switches SA1 are selected by the select signal φA1, the parallel connection of the first and third resistor banks 12, 15 suppresses the occurrence of noise at the nodes N1 to N3 attributable to the switching noise caused by the switches SB1. In this instance, the node N12 exhibits an impedance with respect to the reference voltage $V_{ref1}$ which is higher than the impedance at the node N11, and hence has a higher noise level. However, one of the resistors R2 is interposed between the node N12 and the first resistor bank 12, and hence, the noise at the node N12 is not propagated to the first resistor bank 12. Although the switches SB1 are connected to the switches SA1 without an interposing resistor, the switching noise at the switches SB1 is reduced because the node N1 (or node N11) exhibits a reduced impedance with respect to the reference voltage $V_{ref1}$.

Thus, the parallel connection of the first and third resistor banks 12, 15 and the parallel connection of the second and fourth resistor banks 13, 16 suppresses an adverse influence of noise at the switches SA1–SA4, SB1–SB4 upon the potential of any remaining node N1 to N19. Accordingly, the reference voltage generator circuit 10b delivers a stable reference voltage to the circuits A1 to A4 and B1 to B4.

THIRD EMBODIMMENT

Figure 4:
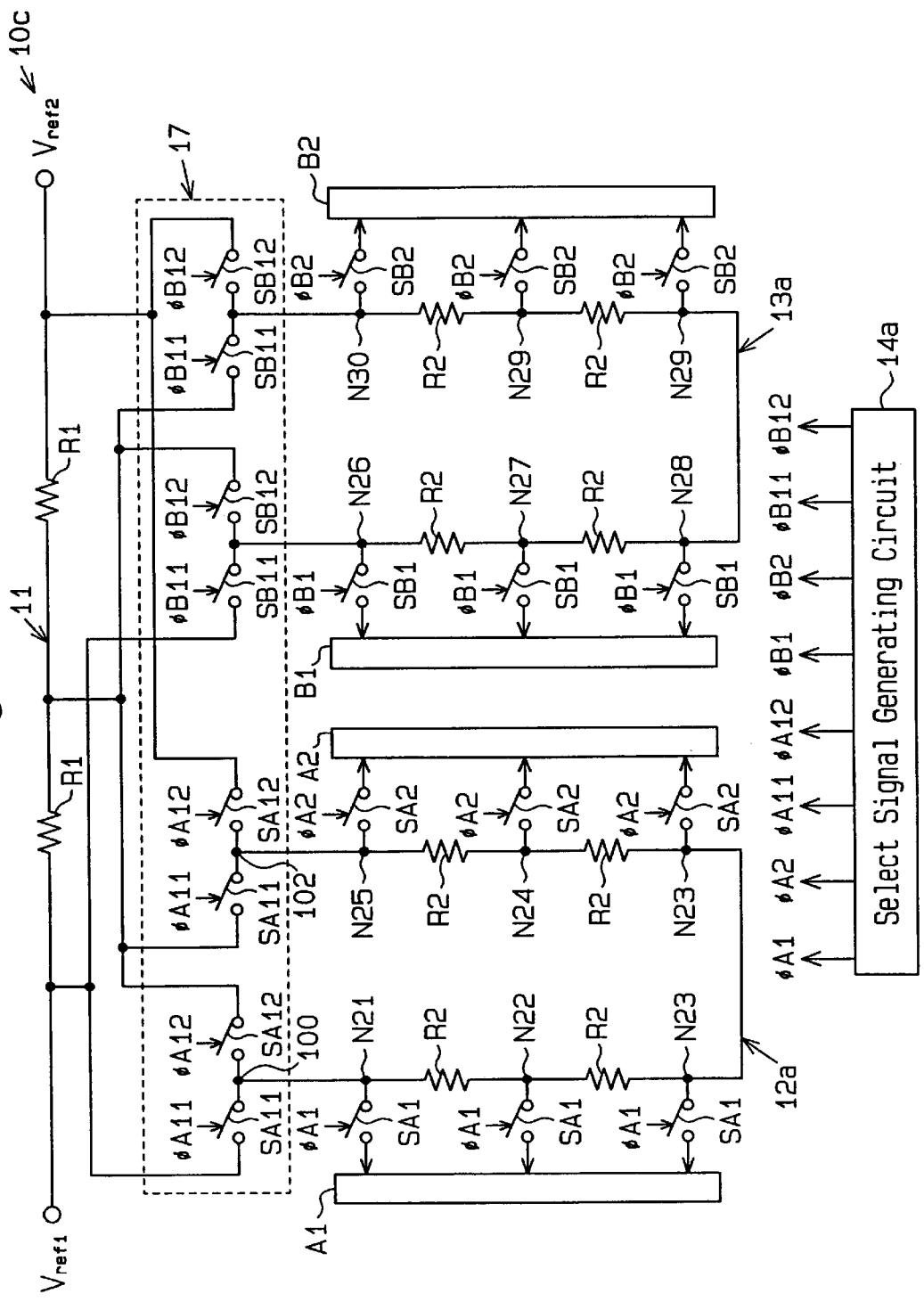
FIG. 4 is a circuit diagram of a reference voltage generator circuit according to a third embodiment of the present invention.

Referring to FIG. 4, a reference voltage generator circuit 10c according to a third embodiment of the present invention will now be described. The reference voltage generator circuit 10c comprises a rough resistor bank 11, a first and a second resistor bank 12a, 13a each including four resistors R2 of substantially equal resistance, and a switching circuit 17 including pairs of changeover switches SA11, SA12 and SB11, SB12.

The first resistor bank 12a includes four resistors R2 which are connected in series and has a pair of terminals 100, 102, each of which is connected to the junction between the changeover switches SA11 and SA12 in each pair. When the changeover switches SA11 are turned on, the first resistor bank 12a is connected in shunt with the resistor R1 of the rough resistor bank 11 located toward the reference voltage $V_{ref1}$, and when the changeover switches SA12 are turned on, the first resistor bank 12a is connected in shunt with the resistor R1 of the rough resistor bank 11 located toward the reference voltage $V_{ref2}$. It will be noted with respect to the first resistor bank 12a that nodes N21 to N25 are defined at the junctions between the switches SA11, SA12 and adjacent resistors R2 as well as at the junctions between respective adjacent resistors R2 in the order of descending potential. A circuit A1 is connected to each of the nodes N21 to N23 via switches SA1 and a circuit A2 is connected to each of the nodes N23 to N25 via switches SA2.

The second resistor bank 13a is constructed in substantially the same manner as the first resistor bank 12a. Switches SB11, SB12 and SB1, SB2 correspond to SA11, SA12 and SA1, SA2, respectively, and circuits B1, B2 correspond to the circuits A1, A2, respectively. It will be noted with respect to the second resistor bank 13a that nodes N26 to N30 are defined at junctions between the switches SB11, SB12 and the adjacent resistors R2 as well as at the junctions between respective adjacent resistors R2 in the order of descending potential.

The changeover switches SA11, SA12 and SB11, SB12 are turned on or off in response to select signals (φA11, φA12 and φB11, φB12, respectively, which are generated by a select signal generator circuit 14a. The switches SA1, SA2, SB1, SB2 are turned on or off in response to select signals φA1, φA2, φB1, φB2, respectively, which are generated by the select signal generator circuit 14a.

The operation of the reference voltage generator circuit 10c will now be described. When the changeover switches SA11 are selected or turned on in response to the select signal φA11, the first resistor bank 12a operates to divide the voltage across the resistor R1, which is located toward the reference voltage $V_{ref1}$, into four equal fractions. When one of the aligned switches SA1, SA2 are selected or turned on in response to the select signal φA1, φA2, the potential at each of the nodes N21 to N25 is delivered as a reference voltage to the circuit A1, A2 via the selected switch SA1, SA2.

On the other hand, when the changeover switch SA12 is selected or turned on in response to the select signal φA12, the first resistor bank 12a operates to divide the voltage across the resistor R1 which is located toward the reference voltage $V_{ref2}$ into four equal fractions. When one of the switches SA1, SA2 is selected or turned on in response to the select signal φA1, φA2, the potential at each of the nodes N21 to N25 is delivered as a reference voltage to the circuit A1, A2 via the selected switch SA1, SA2. It will be understood that with respect to the second resistor bank 13a, the potential at each of nodes N26 to N30 is delivered as a reference voltage to the circuit B1, B2 in response to the select signal φB11, φB12, φB1, φB2, in a similar manner as described above in connection with the first resistor bank 12a.

In the third embodiment, because the first and second resistor banks 12a, 13a are connected in parallel to each other with respect to the rough resistor bank 11, any noise generated by the operation of the switches SA1, SA2 or SB1, SB2 does not influence the potential at the nodes N21 to N25 or N26 to N30. For example, if the switch B1 is turned on in response to the select signal φB1, φB11 when the switches SA1, SA11 are actuated, the occurrence of noise at the nodes N21 to N23 which is attributable to switching noise at the switch SB1 is suppressed. In this instance, the node N28 exhibits an impedance with respect to the reference voltage $V_{ref1}$ which is higher than the nodes N26, N27 exhibit, and accordingly has a higher noise level. However, two of the resistors R2 are interposed between the node N28 and the first resistor bank 12a, and therefore noise therefrom is not propagated to the first resistor bank 12a. Accordingly, the reference voltage generator circuit 10c delivers a stable reference voltage to the circuits A1, A2, B1, B2.

The switching circuit 17 selectively connects the first and second resistor banks 12a, 13a to one of the resistors R1 in the rough resistor bank 11, thus allowing the rough resistor bank 11 to divide the voltage across the connected resistor R1. As a consequence, the number of resistors used is reduced in comparison to an arrangement in which each of the two resistors R1 is associated with a comparable resistor bank, resulting in a reduced circuit area.

FOURTH EMBODIMENT

Figure 5:
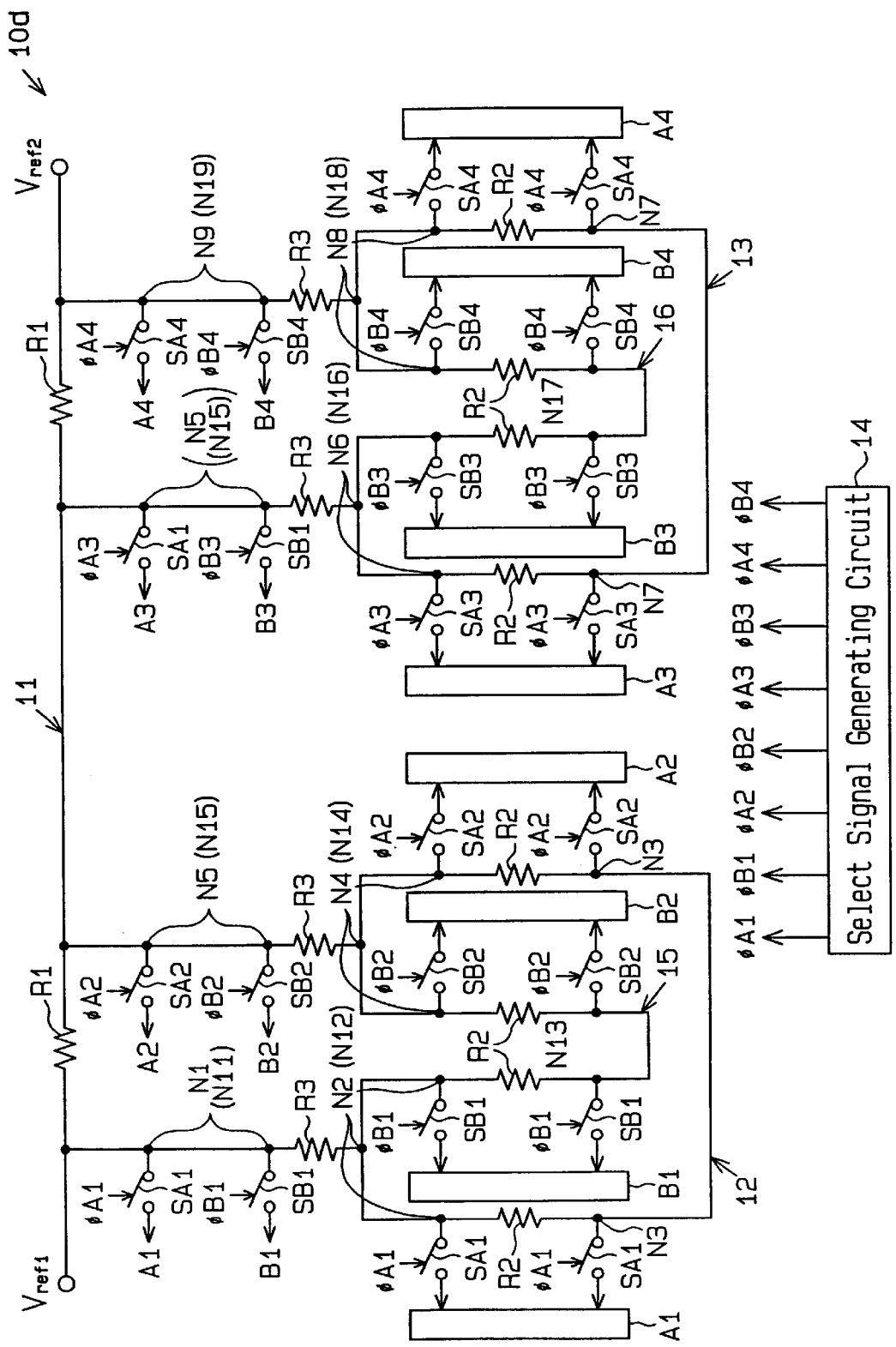
FIG. 5 is a circuit diagram of a reference voltage generator circuit according to a fourth embodiment of the present invention.

Referring to FIG. 5, a reference voltage generator circuit 10d according to a fourth embodiment of the present invention will now be described, principally dealing with its distinction over the reference voltage generator circuit 10a of the first embodiment. In the reference voltage generator circuit 10d, node N2 and node N12 of the first embodiment are connected together, as are nodes N4 and N14. In addition, the resistor R2 between the nodes N1 and N2 and the resistor R2 between the nodes N11 and N12 in the first embodiment are replaced by a single resistor R3 which is common for the both. Furthermore, the resistor R2 between the nodes N4 and N5 and the resistor R2 between the node N14 and N15 are replaced by a common resistor R3. The resistor R3 preferably have a resistance which is one-half the resistance of the resistor R2.

Similarly, with respect to the second and the fourth resistor banks 13, 16, nodes N6 and N16 are connected together as are nodes N8 and N18 of the first embodiment. In addition, the resistor R2 between the nodes N5 and N6 and the resistor R2 between the nodes N15 and N16 are replaced by a common resistor R3, and the resistor R2 between the nodes N8 and N9 and the resistor R2 between nodes N18 and N19 is also replaced by a common resister R3.

In the reference voltage generator circuit 10d, switches SA1 to SA4 and SB1 to SB4 are selected or turned on in response to corresponding select signals φA1 to φA4 and φB1 to φB4, in the same manner as in the reference voltage generator circuit 10a of the first embodiment. The potentials at the nodes N1 to N9 and N11 to N19 are delivered as reference voltages to the circuit A1 to A4 and B1 to B4 via the selected switches SA1 to SA4 and SB1 to SB4.

When the switch SB1 is turned on in response to the select signal φB1 and the switch SA1 is also turned on, the occurrence of noise at the nodes N1 to N3, which is attributable to the operation of the switch SB1, is suppressed because the first and third resistor banks 12, 15 are substantially separated.

In this instance, the node N13 exhibits an impedance with respect to the reference voltage $V_{ref1}$ which is higher than that which the nodes N12, N11 exhibit, and therefore has a higher noise level. However, because one of the resistors R2 is interposed between the node N13 and the first resistor bank 12, the noise at the node N13 is not propagated to the first resistor bank 12. The switches SA1 and SB1 are connected in parallel to each of the nodes N1 (or node N11) and N2 (or node N12), and accordingly, switching noise occurring at the switch SB1 may have an adverse influence upon the switch SA1. However, since the nodes N1, N2 (or nodes N11, N12) exhibit a relatively low impedance with respect to the reference voltage $V_{ref1}$, switching noise at the switch SB1 is reduced. Accordingly, the reference voltage generator circuit 10d delivers a stable reference voltage to each of the circuits A1 to A4 and B1 to B4.

The use of the common resister R3 allows the total number of resisters R1 to R3 to be reduced as compared with the first embodiment, providing a consequent reduction in the circuit area.

FIFTH EMBODIMENT

Figure 6:
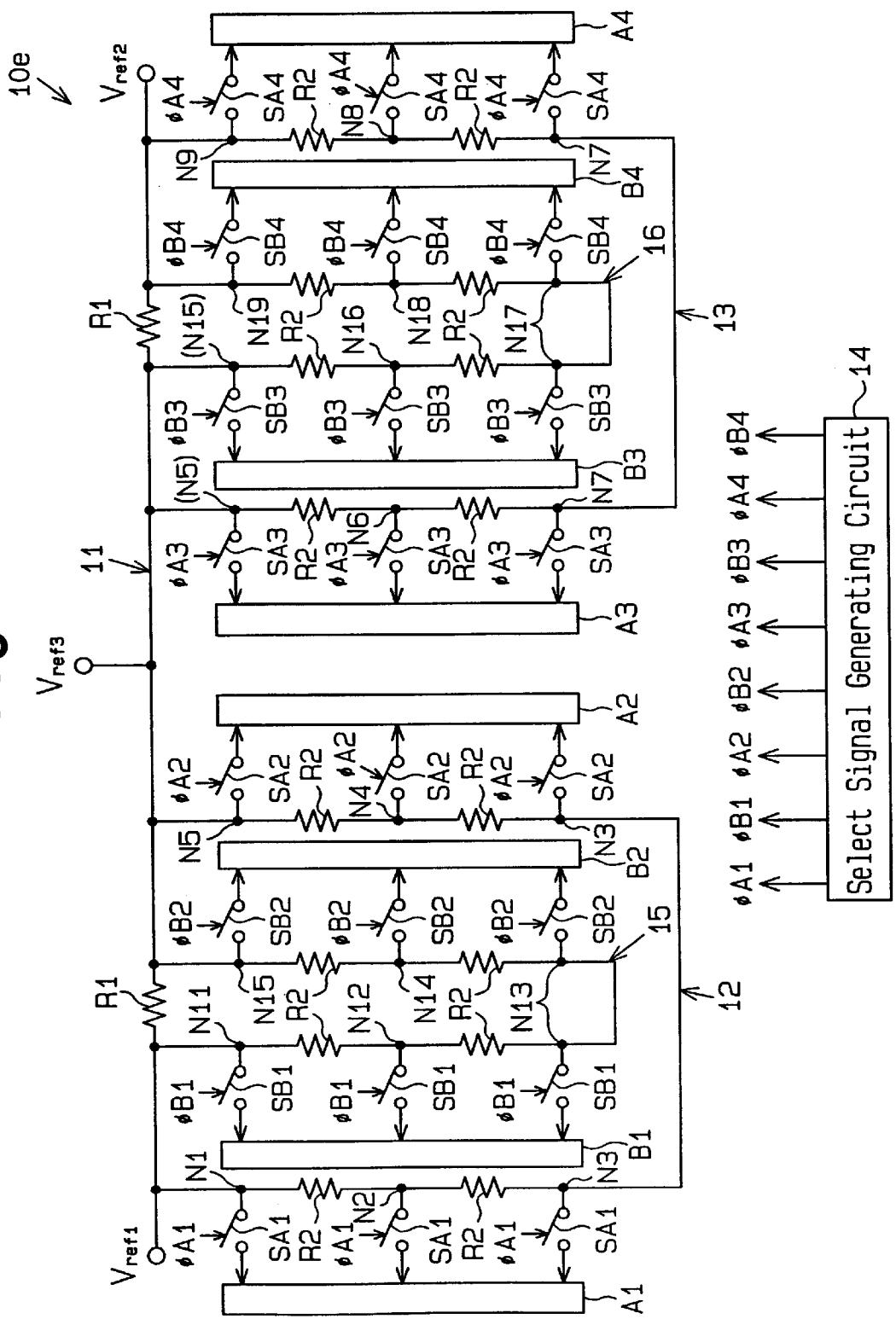
FIG. 6 is a circuit diagram of a reference voltage generator circuit according to a fifth embodiment of the present invention.

Referring now to FIG. 6, a reference voltage generator circuit 10e according to a fifth embodiment of the invention is shown which includes a reference voltage Vref3 added to the reference voltage generator circuit 10a of the first embodiment. Specifically, the reference voltage Vref3 having a voltage level which is intermediate the reference voltages $V_{ref1}$, $V_{ref2}$ is supplied to the junction between the pair of resistors R1 of the rough resistor bank 11.

The supply of the reference voltage Vref3 allows the age potential difference between the reference voltages $V_{ref1}$, $V_{ref2}$ to be divided into two equal fractions without being influenced by a variation in the resistance of the respective resistors R1. Accordingly, the reference voltage generator circuit 10e can deliver a more stable reference voltage to each of the circuits A1 to A4 and B1 to B4.

SIXTH EMBODIMENT

Figure 7:
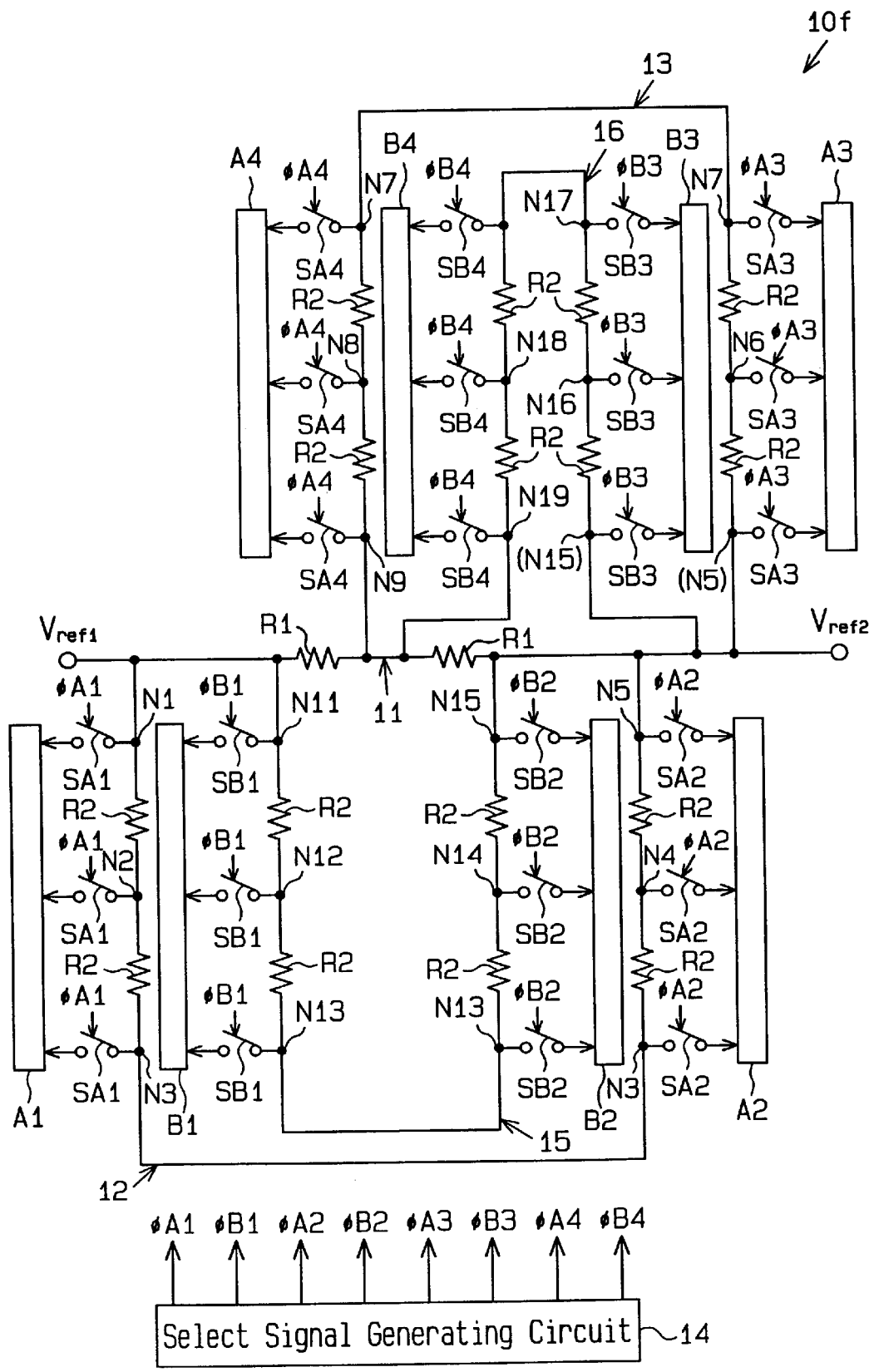
FIG. 7 is a circuit diagram of a reference voltage generator circuit according to a sixth embodiment of the present invention.

As shown in FIG. 7, a reference voltage generator circuit 10f according to a sixth embodiment of the invention differs from the reference voltage generator circuit 10a of the first embodiment in that the low potential side terminals of the first and third resistor banks 12, 15 are connected to the reference voltage $V_{ref2}$.

The potential difference between the reference voltages $V_{ref1}$, $V_{ref2}$ is divided into two equal fractions across each resistor R1, and the terminal voltage across the resistor R1 which is located toward the reference voltage $V_{ref2}$ is divided into four equal fractions by respective resistors R2 and the second and fourth resistor banks 13, 16. Also, the potential difference between the reference voltages $V_{ref1}$, $V_{ref2}$ is divided into four equal fractions by respective resistors R2 in the first and third resistor banks 12, 15.

In this arrangement, if the switch SB1 is turned on in response to the select signal φB1 when the switch SA1 is actuated, the occurrence of switching noise at the nodes N1 to N3 attributable to the switch SB1 is suppressed because of the parallel connection of the first and third resistor banks 12, 15.

In this instance, the node N13 exhibits an impedance with respect to the reference voltage $V_{ref1}$ which is higher than that at the nodes N12, N11, and therefore has a higher noise level. However, two resistors R2 are interposed between the node N13 and the first resistor bank 12, and accordingly, such noise is not propagated to the first resistor bank 12. Because the switches SA1 and SB1 are connected in parallel to each other to the node N1 (or node N11), switching noise at the switch SB1 may have an adverse influence upon the switch SA1. However, because the node N1 (or node N11) exhibits a low impedance with respect to the reference voltage $V_{ref1}$, the switching noise at the switch SB1 is reduced. Accordingly, the reference voltage generator circuit 10f delivers a stable reference voltage to each of the circuits A1 to A4 and B1 to B4, generally in the same manner as in the first embodiment.

It should be understood that in the described embodiments that the number of resistors R1, R2, R3 in respective resistor banks 11, 11a, 12, 12a, 13, 13a, 15 and 16 can be changed as desired. The resistances of the respective resistors R1, R2 and R3 can also be altered as desired. Therefore, the present examples and embodiments are to be considered as illustrative and not restrictive and the invention is not to be limited to the details given herein, but may be modified within the scope and the equivalence of the appended claims.

What is claimed is:

1. A reference voltage generator circuit for delivering reference voltages to a plurality of systems including a first system and a second system, comprising:
    a first rough resistor bank including at least one resistor and a second rough resistor bank including at least two resistors, the firs and second rough resistor banks connected in parallel with each other between a high potential side and a low potential side reference voltage;
    a first fine resistor bank connected between the first and second rough resistor banks and connected in shunt with the at least one resistor in the first rough resistor bank and extending between the at least one resistor and a junction between at least two resistors in the second rough resistor bank;
    a second fine resistor bank connected in parallel with the first fine resistor bank;
    a first group of switches connected between nodes between adjacent resistors in the first fine resistor bank and the first system; and
    a second group of switches connected between nodes between adjacent resistors in the second fine resistor bank and the second system.

2. The reference voltage generator circuit according to claim 1, wherein the number of resistors in the first fine resistor bank is equal to the number of resistors in the second fine resistor bank, and the potential at one of the nodes in the first fine resistor bank is substantially equal to the potential at a corresponding node in the second fine resistor bank.

3. The reference voltage generator circuit according to claim 2, wherein each of the first and second fine resistor banks includes a plurality of resistors, which are connected between the first and second rough resistor banks.

4. The reference voltage generator circuit according to claim 3, further comprising a selection circuit for producing select signals, each select signal for selecting one of the switches in the first and second groups, the switches in the first and second groups being selectively actuated in accordance with the select signals.

* * * * *